US008587317B2

(12) United States Patent
Liu et al.

(10) Patent No.: US 8,587,317 B2
(45) Date of Patent: Nov. 19, 2013

(54) DETECTING DEVICE AND DETECTING METHOD FOR MONITORING BATTERY MODULE

(75) Inventors: Chin-Chuan Liu, Niaosong Township, Kaohsiung County (TW); Li-Yang Mei, Kaohsiung (TW); Fu-Kwo Yang, Kaohsiung (TW); Jong-Lin Wu, Kaohsiung (TW)

(73) Assignee: Chung-Shan Institute of Science and Technology, Araments Bureau, Ministry of National Defense, Taoyuan County (TW)

( * ) Notice: Subject to any disclaimer, the term of this patent is extended or adjusted under 35 U.S.C. 154(b) by 470 days.

(21) Appl. No.: 12/748,338

(22) Filed: Mar. 26, 2010

(65) Prior Publication Data
US 2011/0234231 A1     Sep. 29, 2011

(51) Int. Cl.
  *G01N 27/416*     (2006.01)
  *H02J 7/00*     (2006.01)
(52) U.S. Cl.
  USPC .......................................... 324/429; 320/116
(58) Field of Classification Search
  USPC ......... 324/425–437, 512, 522, 523, 525, 526, 324/750.3, 538, 555, 605–609, 691, 704, 324/705, 706, 713–718; 320/116–123; 307/10.7
  See application file for complete search history.

(56) References Cited

U.S. PATENT DOCUMENTS 6,160,402 A * 12/2000 Naglich et al. ................ 324/421
2004/0000915 A1 * 1/2004 Raichle et al. ................ 324/522

FOREIGN PATENT DOCUMENTS

JP       03087672 A  *  4/1991  ............. G01R 31/00

OTHER PUBLICATIONS

Shunt, available at http://en.wikipedia.org/wiki/Shunt_(electrical) on Mar. 4, 2009.*
Voltmeter, available at http://en.wikipedia.org/wiki/Voltmeter on Jan. 22, 2009.*

* cited by examiner

*Primary Examiner* — Melissa Koval
*Assistant Examiner* — Daniel Miller

(57) ABSTRACT

A detecting device and a detecting method for monitoring a battery module are provided. The battery module is electrically connected to a load and includes a first battery unit, a second battery unit and a connecting device. The connecting device connects the positive electrode of the first battery unit to the negative electrode of the second battery unit. The detecting device includes a shunt, a voltage detecting module and a control module. The shunt is serial connected between the battery module and the load to measures the load current. The voltage detecting module measures the voltage difference across the connecting device between the positive electrode and the negative electrode. The control module computes the equivalent resistance across the connecting device between the positive electrode and the negative electrode according to the load current and the voltage difference. Therefore, the hazard caused by aging of the electric circuit can be prevented by monitoring the equivalent resistance, which infers the change of the assembly quality.

3 Claims, 3 Drawing Sheets

DETECTING DEVICE AND DETECTING METHOD FOR MONITORING BATTERY MODULE

BACKGROUND OF THE INVENTION

1. Field of the Invention

The invention relates to a battery module detecting device and a battery module detecting method, and more particularly, to a detecting device and a detecting method of measuring the resistance of the connecting device instantly when the battery module is used, so that the resistance can be an assembly quality indicator of the battery module.

2. Description of the Prior Art

A battery is a device of converting the energy generated by the chemical reaction into the electrical energy. A single battery unit can only provide a fixed range of voltage depending on the types of its chemical reactions. Therefore, in order to provide a power source of higher voltage or other specific voltage, in practical applications, several battery units are usually connected serially or in parallel to be a battery module, and then the power is outputted.

A battery module formed by several battery units connected serially or in parallel. The quality of the battery module depends on not only the quality of the battery units, but also the connection arts between the battery units. In order to obtain the battery module having better quality, the battery units having better quality can be selected in advance to form the battery module. And, the quality of the connection arts between the battery units depends on the skills of assembling and designing the connecting mechanisms between different battery units.

In the battery module, the connection between two battery units is achieved by electrically connecting two electrodes having different polarities on different battery units respectively. In detail, the two electrodes can be directly contacted, or connected by a metal rod or wire. If the electrodes are directly contacted, it will be inconvenient for disposing, using, or inspection and maintenance. Therefore, in practical applications, it is common that the battery units are firstly arranged side by side to make the electrodes at the same side, and then the metal connecting rod is used to connect the electrodes.

If the metal connecting rod is used to connect the electrodes, the problem that the conduction quality is hard to be controlled must be taken into consideration. More detail, the conditions of oxidation or loosing may be occurred on the contacting points or surfaces between the metal connecting rod and the electrodes of the battery units to cause the increasing of the resistance. In this condition, if the battery module is continued to be used, the temperature of the loosed contacting points or surfaces will be high to cause the fire on the circuit or other electronic hazards.

In general, the metal connecting rod is locked on the electrode of the battery unit through the screw; therefore, the assembling quality between the battery units conventionally depends on the locking torque of assembling screw. The larger locking torque of assembling screw usually means firmer locking condition to prevent the increasing of the resistance caused by the shrinking of the contacting area, and the opportunity that the contacting surface of the metal connecting rod and the electrodes can be also reduced to lower the possibility of resistance increased caused by the oxidation of the contacting surface.

Since the tiding degree of the screw used to lock the metal connecting rod and electrodes may be changed with time, therefore, the locking quality of the screw must be usually tested to make sure the assembling quality and the using safety of the battery module. However, the locking torque of the screw must be measured under the condition that the battery module is not powered, so that the hazards of an electric shock and a short of the circuit will be prevented. Based on the above-mentioned limitations, it is hard to monitor the assembling quality of the battery module on time when the battery module is used.

On the other hand, during the assembling process, there will be some unclean substances (e.g., verdigris or electrolyte) on the surfaces of the metal connecting rod and electrodes to cause the increasing of the contact resistance between the metal connecting rod and electrodes to make the battery module become failure. However, it is hard to measure this variation of resistance by an ordinary low ohmmeter. In detail, the ordinary low ohmmeter is used to measure the resistance of the passive components (e.g., the cable), and its measuring arrange is higher than the milli-ohm level. However, the measuring range of the contacting resistance between the electrodes of the battery and the connecting rod is usually lower than the milli-ohm level. Therefore, it is hard to use the ordinary low ohmmeter to measure the variation of the contacting resistance between the metal connecting rod and electrodes. In addition, the ordinary low ohmmeter is not designed to perform the resistance measurement under the condition that the metal is conducted. Therefore, if the contacting resistance between the metal connecting rod and the electrodes is measured when the battery is powered, it may be very dangerous to use.

As mentioned above, the variation of the resistance can not be measured by the low ohmmeter when the battery is powered, and the locking torque variation of the screw can not show the variation of the resistance. Therefore, in practical applications, the locking torque variation of the screw fails to be an ideal quantitative indicator to represent the assembling quality of the battery module, and it also lacks other effective methods to monitor the assembling quality of the battery module instantly.

SUMMARY OF THE INVENTION

Therefore, a scope of the invention is to provide a battery module detecting method applied to a battery module to solve the above-mentioned problems in prior arts.

According to an embodiment, the battery module is electrically connected to a load and includes a first battery unit, a second battery unit, and a connecting device, the connecting device connects a positive electrode of the first battery unit to a negative electrode of the second battery unit. The battery module detecting method includes the following steps. At first, the method measures a voltage difference between the positive electrode and the negative electrode. Then, the method measures a load current of the load. At last, the method computes an equivalent resistance between the positive electrode and the negative electrode according to the load current and the voltage difference.

Another scope of the invention is to provide a battery module detecting device applied to a battery module to solve the above-mentioned problems in prior arts.

According to an embodiment, the battery module is electrically connected to a load and includes a first battery unit, a second battery unit, and a connecting device, the connecting device connects a positive electrode of the first battery unit to a negative electrode of the second battery unit. The battery module detecting device includes a voltage detecting module, a shunt, and a control module. The voltage detecting module is used for measuring a voltage difference between the positive electrode and the negative electrode. The shunt is serially connected between the battery module and the load and electrically connected to the voltage detecting module. The shunt is used for measuring a load current of the load. The control module is electrically connected to the voltage detecting module and used for computing an equivalent resistance between the positive electrode and the negative electrode according to the load current and the voltage difference.

Above all, in the battery module detecting device and the battery module detecting method of the invention, the voltage difference between two electrically connected electrodes on different battery units and the load current of the load can be measured when the battery module is powered. The equivalent resistance between these two electrodes can be instantly computed according to the voltage difference and the load current. This equivalent resistance can effectively show the conduction quality between the connecting device and electrodes, therefore, it can be a quantitative indicator of the battery assembling quality. With the battery module detecting device and the battery module detecting method of the invention, the variation of the equivalent resistance can be instantly observed to rapidly indicate the position that the battery module is poor assembled. Thus, the poor contacting condition can be improved by the user instantly to prevent the accident or damage caused by the poor assembling quality.

The objective of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

DETAILED DESCRIPTION OF THE INVENTION

The invention provides a battery module detecting device and a battery module detecting method for instantly monitoring the assembling quality of the battery module. And, the embodiments of the battery module detecting device and the battery module detecting method of the invention will be shown as follows.

Figure 1:
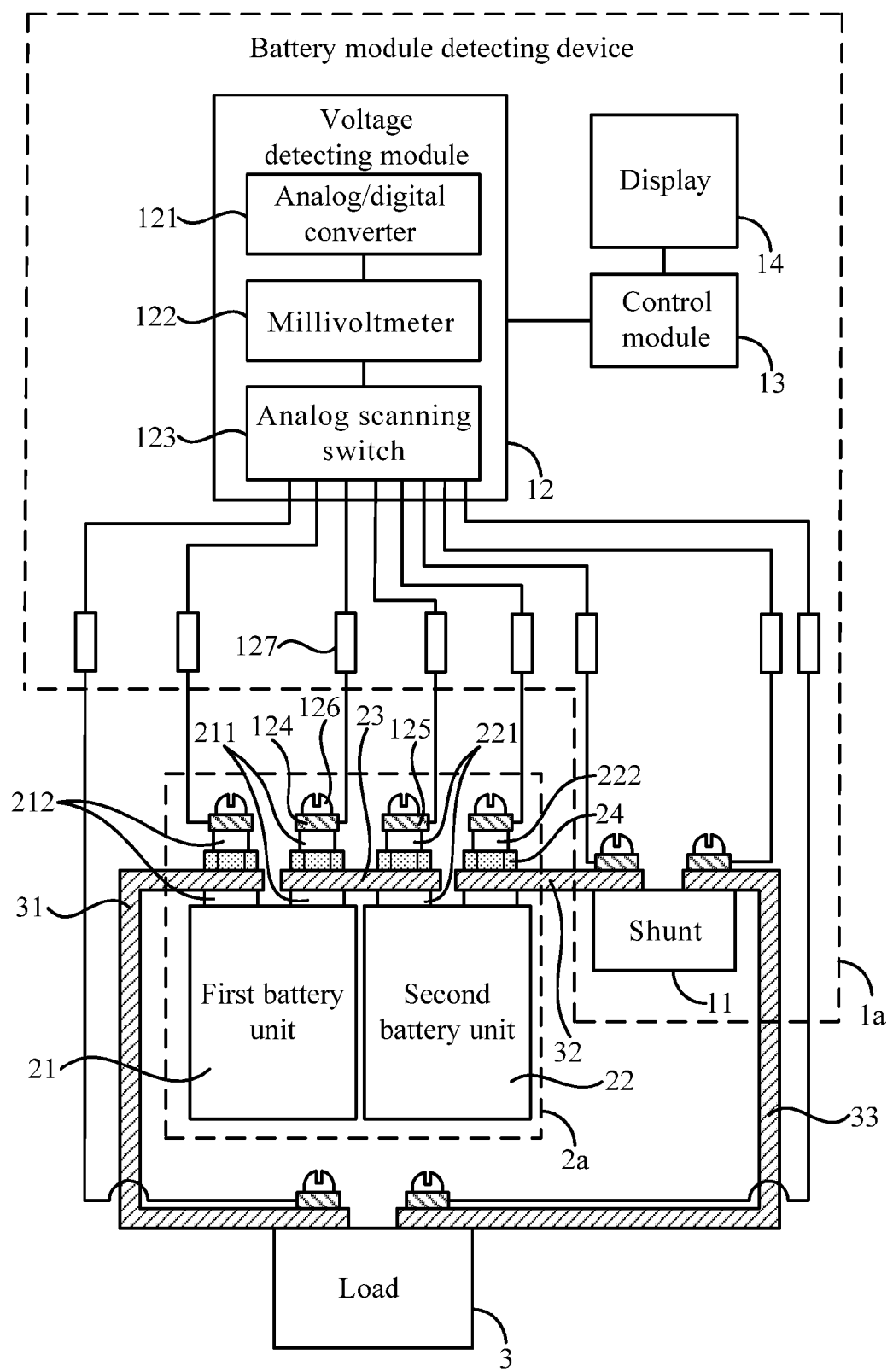
FIG. 1 shows a scheme diagram of a battery module detecting device in an embodiment of the invention.
Figure 2:
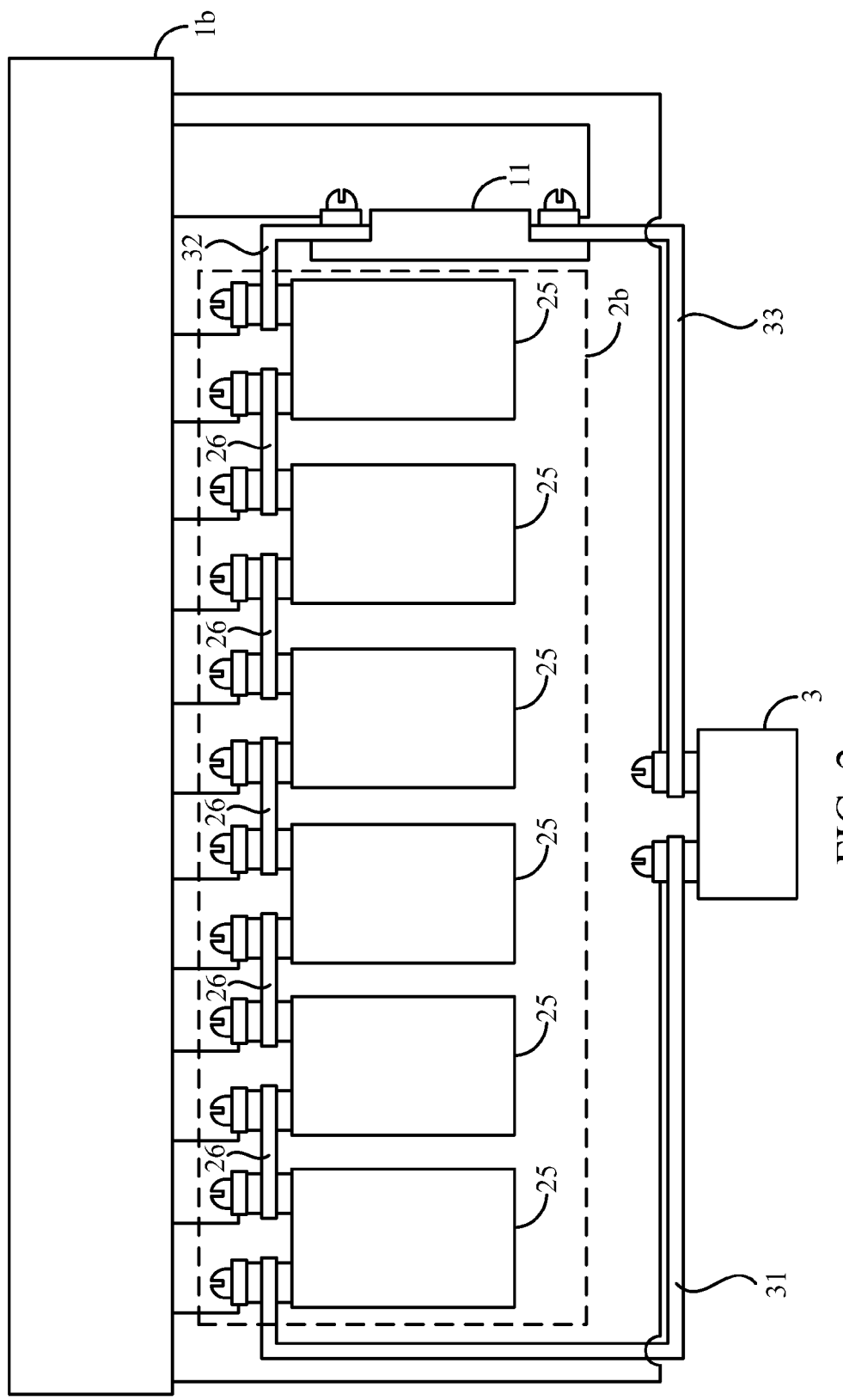
FIG. 2 shows a scheme diagram of a battery module detecting device in an embodiment of the invention.
Figure 3:
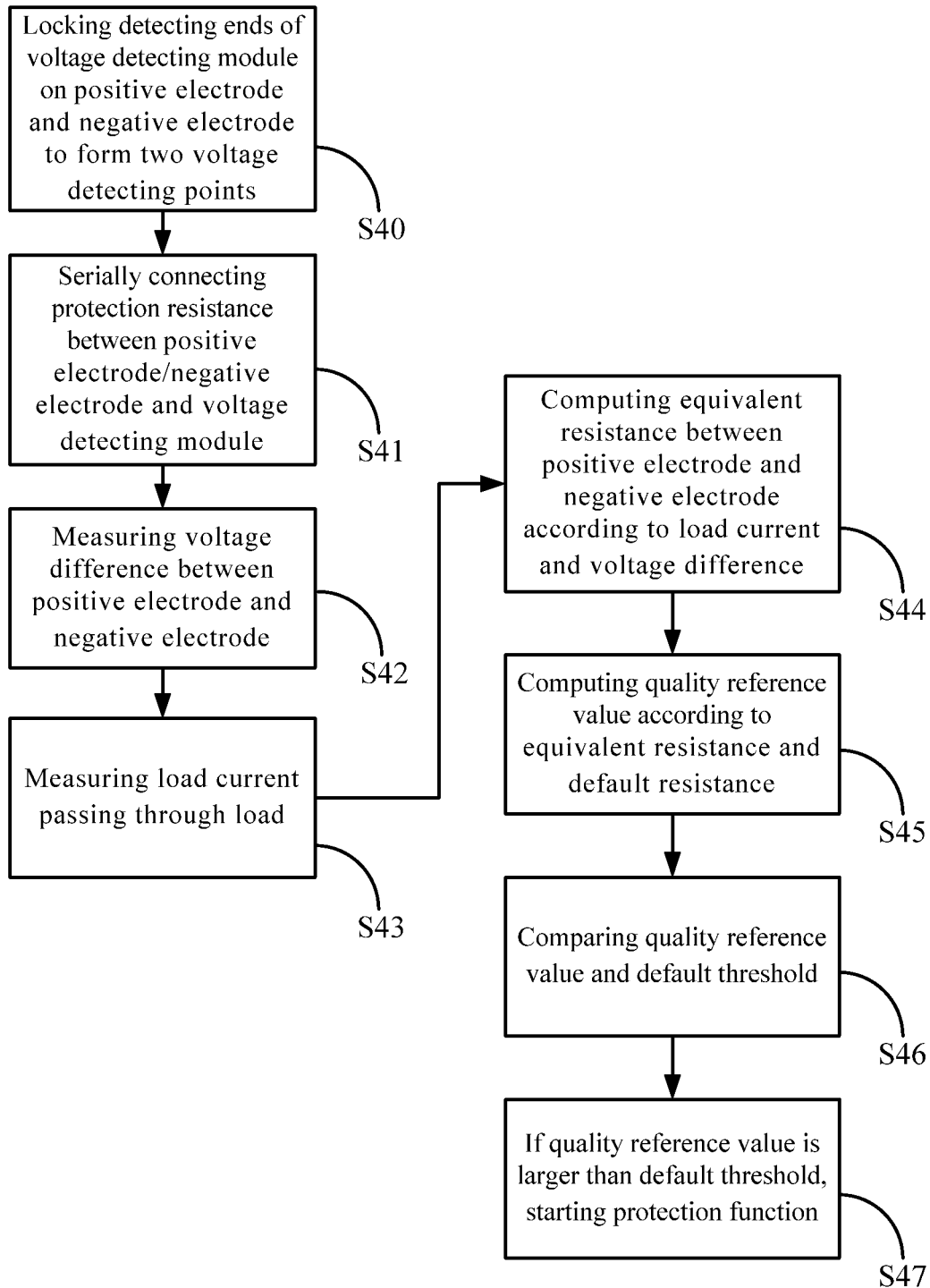
FIG. 3 shows a flowchart of a battery module detecting method in an embodiment of the invention.

FIG. 1 shows a scheme diagram of a battery module detecting device 1a in an embodiment of the invention. FIG. 2 shows a scheme diagram of a battery module detecting device 1b in an embodiment of the invention. FIG. 3 shows a flowchart of a battery module detecting method in an embodiment of the invention.

Please refer to FIG. 1. FIG. 1 shows the battery module detecting device 1a of the first embodiment of the invention. The battery module detecting device 1a is used to test a battery module 2a, and the battery module 2a includes a first battery unit 21, a second battery unit 22, and a connecting device 23. The first battery unit 21 includes a positive electrode 211 and a first output electrode 212 of relative polarity. The second battery unit 22 includes a negative electrode 221 and a second output electrode 222 of relative polarity. The connecting device 23 electrically connects the positive electrode 211 of the first battery unit 21 and the negative electrode 221 of the second battery unit 22. The connecting device 23 is locked on the positive electrode 211 and the negative electrode 221 via two locking devices 24 respectively. In fact, the locking devices 24 can be a screw or other similar locking components. The battery module 2a is electrically connected to a load 3. More detail, one end of the load 3 is electrically connected to the first output electrode 212 of the first battery unit 21 via a first wire 31; another end of the load 3 is electrically connected to the second output electrode 222 of the second battery unit 22 via a second wire 32 and a third wire 33.

The battery module detecting device 1a includes a shunt 11, a voltage detecting module 12, a control module 13, and a display 14. The shunt 11 is serially connected between the battery module 2a and the load 3 and electrically connected to the voltage detecting module 12. The shunt 11 is used for measuring a load current of the load 3. This load current is the current passing through the connecting device 23. The voltage detecting module 12 is mainly used for measuring a voltage difference between the positive electrode 211 and the negative electrode 221. The control module 13 is electrically connected to the voltage detecting module 12 and the display 14 and used for computing an equivalent resistance between the positive electrode 211 and the negative electrode 221 according to the load current and the voltage difference measured and the Ohm's law formula ($V=I*R$). In addition, the control module 13 can make the display 14 to show the information related to the battery module 2a, such as the computed equivalent resistance mentioned above.

More detail, the voltage detecting module 12 can further include an analog/digital converter 121, a millivoltmeter 122, an analog scanning switch 123, and a plurality of detecting ends. The plurality of detecting ends can be disposed on the battery module 2a, the load 3 and any point on the circuit via a detecting end locking device 126 to form the voltage monitoring points. In practical applications, the detecting end locking device 126 can be a screw to lock the detecting ends on the electrodes or other contacting points, or any other kinds of holding devices. The millivoltmeter 122 is used for measuring the voltage difference between the detecting ends (or the voltage detecting points). The analog scanning switch 123 is used for switching the detecting ends measured by the millivoltmeter 122. The analog/digital converter 121 is used for converting an analog signal measured by the millivoltmeter 122 into a digital signal and transmitting the digital signal to the control module 13.

The plurality of detecting ends includes a first detecting end 124 and a second detecting end 125. The first detecting end 124 and the second detecting end 125 are electrically connected and fixed on the positive electrode 211 and the negative electrode 221 respectively via the detecting end fixing device 126 to form two voltage monitoring points. By doing so, the millivoltmeter 122 can use the analog scanning switch 123 to select the first detecting end 124 or the second detecting end 125 to measure the voltage difference between the positive electrode 211 and the negative electrode 221.

In addition, the battery module detecting device 1a can further include a plurality of protection resistors 127 serially connected between the voltage monitoring points and the voltage detecting module 12. For example, the protection resistor 127 can be serially connected between the voltage detecting module 12 and the positive electrode 211 or between the voltage detecting module 12 and the negative electrode 221 to prevent the hazard caused by the short when the voltage is measured. In practical applications, the protection resistor 127 can be also serially connected between the detecting ends and the millivoltmeter 122 or the analog scanning switch 123 as shown in FIG. 1.

By doing so, the battery module detecting device 1a can instantly obtain the equivalent resistance of the connecting device 23 when the battery module 2a provides power. Since the factors affecting the equivalent resistance includes the resistance of the connecting device 23 itself and the contacting resistance between the connecting device 23 and the positive electrode 211 or the negative electrode 221, therefore, the equivalent resistance can be used to represent the quantified value of the assembling quality of the connecting device 23. In the same way, the battery module detecting device 1a can further instantly measure the equivalent resistances of the first wire 31, the second wire 32, and the third wire 33 via other detecting ends of the voltage detecting module 12. If any one of the monitored equivalent resistances mentioned above raises suddenly, it means that any one of the contacting points of the corresponding wire has the condition of loosing or aging.

Not only instantly measuring the equivalent resistance between the contacting points, the battery module detecting device 1a can further have a protection function. In detail, when the battery module 2a is initially used or installed, the battery module detecting device 1a can ask the control module 13 to record the equivalent resistances between the voltage monitoring points to be a default resistance value. When the battery module 2a provides power to the load 3, the control nodule will continually compute the instant equivalent resistance, and compute a quality reference value according to the default resistance value and the instant equivalent resistance. If the quality reference value is larger than a threshold, the battery module detecting device 1a will start a protection function to warn the user the abnormal condition of the circuit. For example, the quality reference value can be the instant equivalent resistance divided by the default resistance value, and the default threshold can be set as 10. When the quality reference value computed is larger than the default threshold, it means that the instant equivalent resistance is 10 times larger than the default resistance value. Thus, the battery module detecting device 1a can warn the user through the display 14 or cut off the power provided by the battery module 2a.

In order to explain the advantages of the battery module detecting device of the invention more clearly, the following will be explained cooperated with theorem and data. Please refer to FIG. 2, FIG. 2 shows the battery module detecting device 1b of the second embodiment of the invention. In this embodiment, the battery module 2b is formed by six battery units 25 serially connected by the connecting device 26. The voltage provided by the battery units 25 is 3.33 volts. After the connecting devices 26 are properly disposed on the battery units 25, each connecting device 26 has the equivalent resistance of 0.2 mΩ.

If the current passing through the load 3 is 50 A, according to the power equation: ($P=I \times V$), the total power provided by the battery module 2b under the load current 50 A is $P_{2b}=50\,A \times 3.33V \times 6=999\,W$. According to the power equation: ($P=I^2 \times R$), the connecting devices 26 has the initial power $P_{26}=50\,A \times 50\,A \times 0.2\,m\Omega=0.5\,W$. If one of the connecting device 26 is loosed or aged, the equivalent resistance will raise 10 times to be 2 mΩ and its instant consumption power $P_{26}'=50\,A \times 50\,A \times 2\,m\Omega=5\,W$. In this view point, the consumption power added by the connecting device 26 will be 4.5 W; however, the added proportion is only 0.45% compared to the total power provided by the battery module 2b. When the battery module 2b continually provides power to the load 3, it is hard to observe so tiny power variation for the load 3. However, form the view point of the equivalent resistance, the 10 times of the rising of the equivalent resistance can clearly point out the variation of the connecting quality.

Please refer to FIG. 3, FIG. 3 shows the flowchart of the battery module detecting method of an embodiment of the invention. This method can be used to the above-mentioned battery module detecting device 1a; therefore, the above-mentioned battery module detecting device 1a will be an example as follows to express the flow of the method.

As shown in FIG. 3, the method of the invention includes the following steps: at first, the first detecting end 124 of the voltage detecting module 12 will be locked on the positive electrode 211, and the second detecting end 125 will be locked on the negative electrode 221 to form two voltage detecting points (step S40). Then, two protection resistors 127 will be serially connected between the voltage detecting module 12 and the positive electrode 211 and between the voltage detecting module 12 and the negative electrode 221 respectively (step S41) to prevent the hazard caused by the short formed during the process of measurement. Then, the voltage detecting module 12 will be used to measure the voltage difference between the positive electrode 211 and the negative electrode 221 (step S42), and the shunt 11 is used to measure the current passing through the load 3 (step S43). Afterward, the control module 13 will be used to compute an equivalent resistance between the positive electrode 211 and the negative electrode 221 according to the measured voltage difference and the current (step S44).

Further, the control module 13 will be used to compute a quality reference value (step S45) according to the equivalent resistance and a default resistance (step S45). The default resistance value can be the equivalent resistance between the positive electrode 211 and the negative electrode 221 measured when the battery module 2a does not provide any power. Or the default resistance value can be the equivalent resistance measured by the battery module detecting device 1a and detecting method when the battery module 2a is assembled and provides power. For example, the quality reference value can be the equivalent resistance minuses the default resistance value, or the equivalent resistance is divided by the default resistance value.

Then, the control module 13 is used to compare the quality reference value and a default threshold (step S46). If the quality reference value is larger than the default threshold, the protection function will be started (step S47). In fact, the protection function of the battery module detecting device 1a can be shown on the display 14 in the form of text or image, or warned by the default buzzer of the battery module detecting device 1a. Further, the battery module detecting device 1a can also have the cut-off function to stop the power provided by the battery module 2a to protect the circuit after the protection function is started.

Above all, with the battery module detecting device and the battery module detecting method of the invention, the equivalent resistance of any connecting devices or wires on the battery module and load can be instantly and dynamically computed during the process of using the battery module. By doing so, the inconvenience that the low ohmmeter can not measure the contact resistance of the connecting device can be solved. With monitoring the variation of the equivalent resistance, whether the assembled parts of the battery module are loosed or the contacting resistance becomes larger can be effectively monitored. The invention can be used to the real time detection and monitoring of all kinds of batteries such as the electric vehicle battery, the torpedo batteries, the submarines battery, or any other system using the battery pack as power supply (e.g., the battery pack of UPS). With the battery module detecting device of the invention, the state of the entire battery module can be controlled to prevent the hazard caused by the battery module, so that the cost of maintaining the battery module will be highly reduced and the safety of the battery module will be enhanced.

Although the present invention has been illustrated and described with reference to the preferred embodiment thereof, it should be understood that it is in no way limited to the details of such embodiment but is capable of numerous modifications within the scope of the appended claims.

What is claimed is:

1. An apparatus, comprising:
   a battery module detecting device (1a) connected to a battery module (2a) of a circuit, the battery module detecting device (1a) for detecting a resistance of n−1 connecting devices (23) of n battery units and three wires (31, 32, 33), wherein n≥2, the circuit comprising:
   the n battery units, represented by battery units 1, . . . n, serially connected via the n−1 connecting devices (23), the n battery units comprising:
     a battery unit 1 (21), comprising a first positive electrode (211) and a first output electrode (212); and
     a battery unit n (22), comprising an nth negative electrode (221) and a second output electrode (222); and
   the n−1 connecting devices (23), connecting two electrodes of different polarities of two battery units neighboring each other of the n battery units by fixing on the two electrodes via two locking devices (24);
   a shunt (11);
   a load (3) powered by the battery module (2a);
   wherein the three wires (31, 32, 33) comprise a first wire (31), a second wire (32), and a third wire (33), with one end of the load (3) connecting the first output electrode (212) of the battery unit 1 (21) via the first wire (31), and another end of the load (3) connecting the second output electrode (222) of the battery unit n (22) via the second wire (32) and the third wire (33), and detecting ends, each of the detecting ends fixed by a detecting end locking device (126);
   wherein the battery module detecting device (1a) comprises:
     the shunt (11), serially connecting the battery module (2a) and the load (3) for measuring a load current of the load (3) running through the n−1 connecting device (23);
     a voltage detecting module (12) connected to the shunt 11 for measuring a voltage between the two electrodes of each of the n−1 connecting devices (23), as well as a voltage across each of the three wires (31, 32, 33), wherein the voltage detecting module (12) comprises:
       an analog scanning switch (123), targeting two of the detecting ends (124, 125) of the plurality of detecting ends;
       a millivoltmeter (122), measuring a voltage difference between electrodes of the two detecting ends (124, 125); and
       an analog/digital converter (121), converting the voltage difference between the electrodes (211, 221) from an analog signal to a digital signal;
     a control module (13) for receiving the digital signal converted by the analog/digital converter (121), wherein the control module (13) is configured to:
       compute an initial equivalent resistance between the two detecting ends of each of the n−1 connecting device (23), as well as for each of the three wires (31, 32, 33), based on an initial load current measured by the shunt (11) and an initial voltage difference measured by the millivoltmeter (122) and converted by an analog/digital converter (121);
       record the initial equivalent resistance as a default resistance;
       calculate a quality reference, based on the default resistance as well as an instant equivalent resistance output continuously by the control device (13);
       compare the quality reference value and a default threshold;
       start a protection function of the battery module detecting device when the quality reference is larger than the default threshold;
       generate a visual output in text messages or equivalent illustrating images, or generate an audio output from a default buzzer of the battery module detecting device (1a); and
       implement an optional cut-off to stop the power provided by the battery module (2a).

2. The battery module detecting device (1a) of claim 1, including a display (14) connecting the control module (13) for displaying the equivalent resistance.

3. The battery module detecting device (1a) of claim 1, including a plurality of protection resistors (127).

\* \* \* \* \*